(12) United States Patent
Takashima

(10) Patent No.: US 7,485,612 B2
(45) Date of Patent: Feb. 3, 2009

(54) ELECTRONIC PARTS CLEANING SOLUTION

(75) Inventor: Masayuki Takashima, Tsukuba (JP)

(73) Assignee: Dongwoo Fine-Chem Co., Ltd., Jeonbuk (KR)

( * ) Notice: Subject to any disclaimer, the term of this patent is extended or adjusted under 35 U.S.C. 154(b) by 749 days.

(21) Appl. No.: 11/174,061

(22) Filed: Jun. 30, 2005

(65) Prior Publication Data
US 2006/0008925 A1 Jan. 12, 2006

(30) Foreign Application Priority Data
Jun. 30, 2004 (JP) .............................. 2004-193260

(51) Int. Cl.
*H01L 21/00* (2006.01)
(52) U.S. Cl. ..................... 510/175; 510/500
(58) Field of Classification Search ................. 510/175, 510/500
See application file for complete search history.

(56) References Cited

U.S. PATENT DOCUMENTS

| | | | |
|---|---|---|---|
| 5,456,760 A * | 10/1995 | Goehausen | 134/40 |
| 6,310,019 B1 * | 10/2001 | Kakizawa et al. | 510/175 |
| 6,472,357 B2 | 10/2002 | Takashima | |
| 6,534,458 B1 * | 3/2003 | Kakizawa et al. | 510/175 |
| 6,716,803 B2 * | 4/2004 | Kakizawa et al. | 510/175 |
| 6,730,644 B1 | 5/2004 | Ishikawa et al. | |
| 6,787,293 B2 * | 9/2004 | Oowada et al. | 430/329 |
| 7,084,097 B2 | 8/2006 | Ishikawa et al. | |
| 7,309,683 B2 * | 12/2007 | Mun et al. | 510/175 |
| 7,348,300 B2 * | 3/2008 | Lassila et al. | 510/175 |
| 2002/0022582 A1 | 2/2002 | Takashima | |
| 2003/0158059 A1 | 8/2003 | Sakai et al. | |
| 2003/0171239 A1 * | 9/2003 | Patel et al. | 510/406 |
| 2003/0228762 A1 * | 12/2003 | Moeggenborg et al. | 438/691 |
| 2003/0228763 A1 * | 12/2003 | Schroeder et al. | 438/691 |
| 2004/0167047 A1 | 8/2004 | Ishikawa et al. | |
| 2004/0244300 A1 * | 12/2004 | Ichiki et al. | 51/307 |
| 2005/0170981 A1 * | 8/2005 | Mun et al. | 510/201 |
| 2005/0176605 A1 * | 8/2005 | Lassila et al. | 510/175 |
| 2005/0287480 A1 * | 12/2005 | Takashima | 430/331 |

FOREIGN PATENT DOCUMENTS

| | | |
|---|---|---|
| JP | 05-043897 | 2/1993 |
| JP | 2001-007071 | 1/2001 |
| JP | 2001-214199 | 8/2001 |
| JP | 2001-214200 | 8/2001 |
| JP | 2001-288496 | 10/2001 |
| KR | 2003-0007969 | 1/2003 |

\* cited by examiner

*Primary Examiner*—Gregory E Webb
(74) *Attorney, Agent, or Firm*—Blakely, Sokoloff, Taylor & Zafman LLP

(57) ABSTRACT

(Object) To provide a new electronic parts cleaning solution that inhibits the corrosion of silicon or metals other than the silicon, and that efficiently cleans off fine dust or organic matters adhered on the surface of electronic parts, and that does not have white turbidity easily.

(Solution) An electronic parts clearing solution which is characterized in containing an anionic surfactant, hydroxide, metal corrosion inhibitor, water, and a nonionic surfactant represented by formula (I) and/or a nonionic surfactant represented by formula (II):

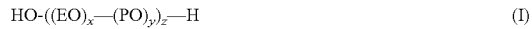

$$HO\text{-}((EO)_x\text{---}(PO)_y)_z\text{---}H \qquad (I)$$

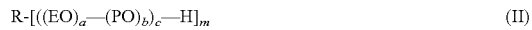

$$R\text{-}[((EO)_a\text{---}(PO)_b)_c\text{---}H]_m \qquad (II)$$

(EO is an oxyethylene group, and PO is an oxypropylene group. x and y, and a and b are positive number, which x(x+y) and a(a+b) are 0.05 to 0.5 respectively, and z and c are positive integers. R is a residue group wherein hydrogen atoms are removed from hydroxyl group of alcohol or amine represented by a group having valency of 1~4).

13 Claims, No Drawings

ELECTRONIC PARTS CLEANING SOLUTION

CROSS-REFERENCE TO RELATED APPLICATIONS

The present patent application claims priority from Japanese Patent Application No. 2004-193260, filed on Jun. 30, 2004.

BACKGROUND OF THE INVENTION (1) Field of the Invention

[Cited invention 1] Japanese Patent Laid-Open No. 2001-288496

[Cited invention 2] Japanese Patent Laid-Open No. 2001-214199

The present invention relates to an electronic parts cleaning solution.

(2) Description of the Related Art

A mixed solution of hydroxide exhibiting alkaline, hydrogen peroxide and water is generally known as a cleaning solution used to clean electronic parts such as liquid crystal display that use glass substrates, or integrated circuit devices that use silicon substrates. Among them, a mixed solution of ammonium hydroxide, hydrogen peroxide and water has been widely used because it is excellent in removing particle-shape contaminants on the substrate. However, when an aqueous alkaline solution containing said hydrogen peroxide is used, there are problems that metals other than the silicon of the surface of the electronic parts get corroded due to hydrogen peroxide, or that silicon gets corroded in aqueous alkaline hydroxide solutions not containing hydrogen peroxide.

Therefore, as a cleaning solution solving the above problem, that is as a cleaning solution that inhibits corrosion of silicon or metals other than the silicon and that also has excellent cleaning effect, we have already proposed a cleaning solution containing hydroxide, water, metal corrosion inhibitor, anionic surfactant and the like (cited invention 1). Also, we proposed a cleaning solution further containing a water-soluble organic compound in order to inhibit white turbidity of said cleaning solution (cited invention 2).

SUMMARY OF THE INVENTION

It is an object of the present invention to provide a new electronic parts cleaning solution that inhibits corrosion of silicon or metals other than the silicon and that can efficiently clean off fine dust or organic matters adhered on the surface of electronic parts, and that does not have white turbidity easily.

Thereafter, as a result of further examination, the present inventors found that an effect equivalent or greater in preventing white turbidity of the solution could be achieved by using an anionic surfactant instead of a water-soluble organic compound, and thus lead to the present invention.

That is, the present invention provides an electronic parts cleaning solution containing an anionic surfactant, hydroxide, water, metal corrosion inhibitor and a nonionic surfactant (hereinafter, the cleaning solution of the present invention) and a method for cleaning electronic parts using the cleaning solution of the present invention.

DETAILED DESCRIPTION OF THE PREFERRED EMBODIMENTS

The cleaning solution of the present invention is characterized in containing an anionic surfactant.

As an anionic surfactant, all of the well-known anionic surfactants can be used. Among them, preferably, a surfactant having anionic functional groups is used.

Said anionic functional group indicates a group exhibiting anionic property in water. It can be specifically exemplified with a group forming sulfonic acid (hereinafter, sulfonic acid group), a group forming sulfuric acid ester (hereinafter, sulfuric acid ester group), a group forming phosphoric acid ester (hereinafter, phosphoric acid ester group), a group forming carboxylic acid (hereinafter, carboxylic acid group) and the like.

Anionic surfactant having sulfonic acid groups can be specifically exemplified with compounds having one anionic functional group such as alkylbenzene sulfonic acid, dialkylsuccinate sulfonic acid, alkylphenoxyethoxyethyl sulfonic acid and the like, or salts thereof, compounds having at least two anionic functional groups such as alkylene disulfonic acid, allylene disulfonic acid, naphthalene sulfonic acid formalin condensate, naphthalene disulfonic acid formalin condensate, phenol sulfonic acid formalin condensate, phenol disulfonic acid formalin condensate, phenyl phenol sulfonic acid formalin condensate, phenyl phenol disulfonic acid formalin condensate and the like, or salts thereof, and compounds having at least two anionic functional groups such as alkyl diphenyl ether disulfonic acid and the like and further having ether bond, or salts thereof.

Said salts can be exemplified with salts of sodium, calcium, ammonium, triethanol amine, disodium, dicalcium, diammonium, ditriethanol amine and the like.

Among them, alkyldiphenyletherdisulfonic acid or a salt thereof is preferable, and for example, dodecyldiphenylether disulfonic acid disodium salt, dodecyldiphenylether disulfonic acid diammonium salt, dodecyldiphenylether disulfonic acid diammonium salt or dodecyldiphenylether disulfonic acid ditriethanol amine salt are preferable.

Anionic surfactant having sulfuric acid ester groups can be specifically exemplified with methyl taurine such as alkylmethyl taurine, acylmethyl taurine, fatty acid methyl taurine, and compounds having one anionic functional group such as polyoxyalkylenealkylphenylether sulfuric acid ester, polyoxyalkylenealkylether sulfuric acid ester, polyoxyalkylenepolycyclicphenylether sulfuric acid ester, polyoxyalkylenearylether sulfuric acid ester and the like or salts thereof.

Said salts can be exemplified with salts of sodium, calcium, ammonium, triethanol amine and the like.

Anionic surfactant having phosphoric acid ester group can be specifically exemplified with compounds having at least one anionic functional groups such as polyoxyalkylenealkylether phosphoric acid, polyoxyalkylenealkylphenylether phosphoric acid and the like and further having ether bond, or salts thereof, compounds having at least two anionic functional groups such as alkyldiphenylether disulfonic acid and the like and further having ether bond, or salts thereof, Said salts can be exemplified with salts of sodium, calcium, ammonium, triethanolamine, disodium, dicalcium, diammonium, ditriethanolamine and the like.

Anionic surfactant having carboxylic acid group can be specifically exemplified with sarcosine type compounds such as acyl sarcosine, fatty acid sarcosine and the like, fatty acid type compounds such as palm oil, oleic acid or salts thereof, and compounds having at least two anionic functional group and further having ether bond can be specifically exemplified with compounds such as alkyldiphenylether dicarboxylic acid and the like or salts thereof.

Said salts can be exemplified with salts of sodium, calcium, ammonium, trinethanolamine, disodium, dicalcium, diammonium, ditriethanolamine and the like.

Anionic surfactant having at least two different anionic functional group in molecular structure can be specifically exemplified with compounds such as alkylsulfosunccinic acid, polyoxyalkylenealkylsulfosuccinic acid, monoalkyl-succinatesulfonic acid and the like, which are the anionic surfactant having sulfonic acid group and carboxylic acid group, or salts thereof.

The cleaning solution of the present invention may contain at least two types of said anionic surfactant group.

For the cleaning solution of the present invention, it is preferable to use an anionic surfactant having sulfonic acid group and/or sulfuric acid ester group, and more preferable to use an anionic surfactant having at least two anionic functional group. Furthermore, it is particularly preferable to be an anionic surfactant having at least two anionic functional group in molecular structure and further having ether bond in an aspect of preservation stability of the obtained cleaning solution.

The cleaning solution of the present invention contains generally 0.001 to 10 wt %, preferably 0.001 to 1 wt % and more preferably 0.001 to 0.5 wt % of an anionic surfactant.

When the amount of said anionic surfactant is less than 0.001 wt %, if the cleaning solution is heated above 60° C., it tends to be difficult to obtain the effect of preventing the white turbidity. When the amount of said anionic surfactant is more than 10 wt %, bubble forming possibility is increased, thereby making it difficult to treat when use.

The hydroxide group contained in the cleaning solution of the present invention can be exemplified with inorganic, organic hydroxide and the like. The inorganic hydroxide group can be specifically exemplified with ammonium hydroxide, potassium hydroxide, sodium hydroxide and the like, and the organic hydroxide group can be specifically exemplified with ammonium tetramethyl hydroxide, choline and the like. The cleaning solution of the present invention may contain at least two types of said hydroxide group.

Among them, it is preferable to use ammonium hydroxide or ammonium tetramethyl hydroxide in an aspect of preventing metal contamination on electronic parts.

The cleaning solution of the present invention contains generally 0.01 to 31 wt %, preferably 0.05 to 10 wt % and more preferably 0.1 to 5.0 wt % of said hydroxide. In the cleaning solution of the present invention, when the amount of said hydroxide is less than 0.01 wt %, the cleaning effect tends to deteriorate, meanwhile when the amount of said hydroxide is more than 31 wt %, it tends to be more difficult to prepare the cleaning solution of the present invention.

The metal corrosion inhibitor contained in the cleaning solution of the present invention is an organic compound having at least one selected from the group consisting of nitrogen, oxygen, phosphorus and sulfur atom in molecule, and can be exemplified with a compound having at least one mercapto group in molecule; a compound comprising at least one azole group in molecule; a compound having at least two hydroxy group in molecule; a compound comprising at least one hydroxy group and carboxy group in molecule; a compound comprising at least one mercapto group, being an aliphatic alcohol compound wherein at least two carbon is comprised and the carbon attached to mercapto group is adjacent to the carbon attached to hydroxy group.

Specifically, a compound having at least one mercapto group in molecule can be exemplified with thioacetic acid, thiobenzoic acid, thioglycol, thioglycerol, cysteinic acid and the like; a compound comprising at least one azole group in molecule can be exemplified with benzotriazole, tortriazole, 4-methylimidazole, 1-hydroxybenzotriazole, 5-hydroxymethyl-4-methylimidazole, 3-aminotriazole and the like; a compound having at least two hydroxy group in molecule can be exemplified with catechol, resorcinol, hydroquinone, pyrogallol and the like; a compound comprising at least one hydroxy group and carboxy group in molecule can be exemplified with gallic acid, tannic acid and the like; a compound comprising at least one mercapto group in molecule, being an aliphatic alcohol compound wherein at least two carbon is comprised and the carbon attached to mercapto group is adjacent to the carbon attached to hydroxy group, can be exemplified with thioglycol, thioglycerol and the like.

The cleaning solution of the present invention may contain at least two types of said metal corrosion inhibitor.

The metal corrosion inhibitor contained in the cleaning solution of the present invention is chosen properly according to the type of metal exposed to the surface of electronic parts, which are to be cleaned.

For example, when the metal to be cleaned is tungsten, it is preferable that the cleaning solution of the present invention contains at least one selected from the group consisting of a compound having at least one mercapto group in molecule, a compound comprising at least two hydroxy group in molecule and a compound having at least one hydroxy group and carboxy group in molecule.

Also, when the metal to be cleaned is copper, it is preferable that the cleaning solution of the present invention contains at least one selected from the group consisting of a compound comprising at least one mercapto group in molecule and a compound comprising at least one azole group in molecule, being an aliphatic alcohol compound wherein at least two carbon is comprised and the carbon attached to mercapto group is adjacent to the carbon attached to hydroxy group.

According to the type of metal to be cleaned, several types of metal corrosion inhibitors may be contained in the cleaning solution of the present invention.

The cleaning solution of the present invention contains generally 0.0001 to 5 wt %, and preferably 0.001 to 1 wt % of metal corrosion inhibitor. In the cleaning solution of the present invention, when the amount of said metal corrosion inhibitor is less than 0.0001 wt %, it tends to be difficult to show the effect of metal corrosion inhibition, when more than 5 wt %, solubility into the cleaning solution tends to deteriorate.

The cleaning solution of the present invention contains a nonionic surfactant. As for said nonionic surfactant, the nonionic surfactant represented by formula (I) and/or (II) is generally contained:

$$HO\text{-}((EO)_x\text{—}(PO)_y)_z\text{—}H \tag{I}$$

$$R\text{-}[((EO)_a\text{—}(PO)_b)_c\text{—}H]_m \tag{II}$$

(EO is oxyethylene group and PO is oxypropylene group. x and y, and a and b are positive numbers, which x/(x+y) and a/(a+b) are 0.05 to 0.5 respectively, and z and c are positive integers. R is a monovalent group of

$$R1\text{-}O\text{—} \tag{1}$$

$$H_2N\text{—}R1\text{-}NH\text{—} \tag{2}$$

$$H_2N\text{—}R1\text{-}O\text{—} \tag{3}$$

a divalent group of

$$\text{—}O\text{—}R1\text{—}O\text{—} \tag{4}$$

-continued

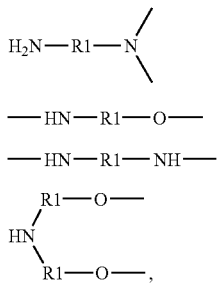

a trivalent group of

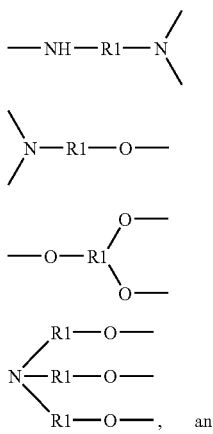

a tetravalent group of

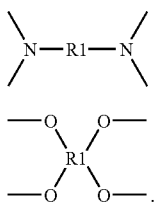

R1 is a hydrocarbon group having $C_{1-20}$, which may be substituted with hydroxy group and/or alkyl group, and m is an integer from 1 to 4 corresponding the valency of R.).

In formula (I) and (II), the oxyethylene group is represented by —$CH_2$—$CH_2$—O—, and oxypopylene group by $CH(CH_3)$—$CH_2$—O— or $CH_2$—$CH(CH_3)$—O—.

In formula (I) and (II), x and y, and a and b are positive numbers, which x/(x+y) and a/(a+b) are 0.05 to 0.5 respectively, and z and c are positive integers.

When x/(x+y) and a/(a+b) are less than 0.05 respectively, the solubility in adjusting the cleaning solution becomes insufficient, meanwhile when more than 0.5, the bubble removing property of the solution becomes insufficient. The cleaning solution of the present invention may contain at least two compounds, which have different values for x/(x+y) and/or a/(a+b).

The polymer moiety of the oxyethylene group and the oxypropylene group represented by $((EO)_x$—$(PO)_y)_z$ in formula (I) and $((EO)_a$—$(PO)_b)_c$ in formula (II) can be block-copolymer, random-copolymer, or random-copolymer with block-characteristics. Among them, block-copolymer is preferable.

R is represented by monovalent, divalent, trivalent or tetravalent group; R1 is hydrocarbon group having $C_{1-20}$, which may be substituted with hydroxy group and/or alkyl group.

Hydrocarbon group can be specifically exemplified with alkyl group such as methyl group, ethyl group, propyl group, butyl group and the like; alkylene group such as methylene group, ethylene group, trimethylene group, propylene group and the like; alkenyl group such as vinyl group, allyl group and the like; phenyl group and the like.

R represented by monovalent to tetravalent group can be more specifically exemplified with the residue group wherein hydrogen atom is removed from hydroxide group of alcohol or amine.

As alcohol or amine, the compound represented by monovalent group can be exemplified with 2-ethylhexyl alcohol, lauryl alcohol, cetyle alcohol, oleil alcohol, tridecyl alcohol, tallow fatty alcohol and coconut oil alcohol, monoethanolamine and the like; the compound represented by divalent group can be exemplified with ethylene glycol, propylene glycol, 1,3-propanediol, 1,2-butandiol, 1,3-butandiol, 2,3-butandiol, 1,4-butandiol, 2-methyl-1,2-propanediol, 2-methyl-1,3-propanediol, diethanolamine and the like; the compound represented by trivalent group can be exemplified with glycerin, trimethylolethane, trimethylolpropane and the like; the compound represented by tetravalent group can be exemplified with pentaerytritol, sorbitol, triethanolamine, ethylenediamine, propylenediamine and the like.

In formula (II), m is an integer from 1 to 4 corresponding the valency of R.

As for the nonionic surfactant in formula (I) and/or the nonionic surfactant in formula (II), the average molecular weight of the sum of the oxypropylene is generally 500 to 5000, preferably 900 to 3500, and more preferably 1500 to 3500.

If the average molecular weight is less than 500, the cleaning capability may become insufficient, meanwhile, if more than 5000, the solubility in adjusting tends to deteriorate.

An nonionic surfactant represented by formula (I) can be specifically exemplified with polyoxyethylenepolyoxypropylene condensate, polyoxypropylenepolyoxyethylene condensate and the like.

An nonionic surfactant represented by formula (II) can be specifically exemplified with polyoxyethylenepolyoxypropylene2-ethylhexylether, polyoxyethylenepolyoxypropylenelaurylether, polyoxyethylenepolyoxypropylenestearylether, glycerin-added polyoxyethylenepolyoxypropylene condensate, ethylenediamine-added polyoxyethylenepolyoxypropylene condensate and the like.

The cleaning solution of the present invention may contain at least two nonionic surfactants, and the nonionic surfactant represented by formula (I) and the nonionic surfactant by formula (II) may be contained respectively, and also together.

The cleaning solution of the present invention contains generally 0.0001 to 10 wt %, preferably 0.001 to 1.0 wt %, and more preferably 0.001 to 0.1 wt % of the nonionic surfactants represented by formula (I) or (II).

When the amount of the nonionic surfactant is less than 0.0001 wt %, corrosiveness against silicon tends to increase; meanwhile, when more than 10 wt %, it tends to be difficult to treat since foaming property of the solution becomes intense.

The cleaning solution of the present invention may contain a reducing agent to improve the effect due to the metal corrosion inhibitor.

The reducing agent may be contained in the cleaning solution of the present invention can be exemplified with hydrazine, hydroxylamine, aliphatic saturated monocarboxyl acid type, aldehyde type and derivatives type thereof, compounds containing reactive double bond or multiple bond, and amine derivatives of boron hydride alkali compound.

Hydrazine and a derivative thereof are represented by formula (III) as below:

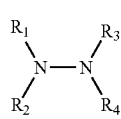
(II)

(R1, R2, R3 and R4 is each and independently hydrogen atom, alkyl group having $C_{1-6}$, cycloalkyl group having $C_{6-10}$, alkenyl group having $C_{2-6}$, alkynyl group having $C_{2-6}$, carboxyl group, alkylamino group having $C_{1-6}$ or hydroxy substituted alkyl group).

Hydrazine and a derivative thereof represented by formula (III) can be specifically exemplified with hydrazine, methylhydrazine, 1,1-dimethylhydrazine, hydroxyl ethanol and the like; and further salts thereof such as hydrazine sulfate, hydrazine carbonate, tolilylhydrazin hydrochloric acid salt.

Hydroxylamine and a derivative thereof are represented by formula (IV):

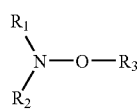
(IV)

(R1, R2 and R3 are each and independently hydrogen atom, alkyl group having C1-6, cycloalkyl group having C6-10, alkenyl group having C2-6, alkynyl group having C2-6, carboxyl group, alkylamino group having C1-6 or hydroxy substituted alkyl group).

Hydrazine and a derivative thereof represented by formula (IV) can be specifically exemplified with hydroxylamine, N-methylhydroxylamine, N,N-dimethylhydroxylamine, N,N-diethylhydroxylamine and the like; and further salts thereof such as hydroxylamine hydrochloric acid salt, sulfate hydroxylamine and the like.

Aliphatic saturated monocarboxy acid type and a derivative thereof can be specifically exemplified with formic acid, acetic acid, propionic acid, butyric acid, valeric acid and the like; and further salts thereof such as ammonium formate, sodium formate, potassium formate, ammonium acetate, sodium acetate, potassium acetate and the like.

Aldehyde type and a derivative thereof can be specifically exemplified with formaldehyde, acetaldehyde, benzaldehyde, hydroxy benzaldehyde and the like.

A compound containing reactive double or multiple bond can be specifically exemplified with 2-butyne-1,4-diol, 2-butyne-1ol, 3-butyne-1ol, L-ascorbic acid, erythorbic acid, uric acid and the like.

Amine derivative of a boron hydride alkali compound can be exemplified with dimethylamine borane and the like.

When amine derivative of a boron hydride alkali compound is contained in the cleaning solution of the present invention, the amount of a reducing agent in the cleaning solution of the present invention is generally 0.01 to 20 wt %, and preferably, 0.1 to 10 wt %. When the concentration is less than 0.01 wt %, it tends to become easier to lower the corrosion inhibition effect for metals, and when more than 20 wt %, the manufacturing cost tends to increase.

The cleaning solution of the present invention is obtained by mixing water with a small amount of each component. The combining order or method is not particularly limited, and various kinds of known methods can be applied.

The cleaning solution of the present invention is difficult to have white turbidity even at high temperatures of at least 60° C., and also can be used for a long period of time.

The temperature of the cleaning solution of the present invention in use is in the range of generally 10 to 80° C., preferably 40 to 80° C., and more preferably 60 to 80° C.

As a method for cleaning electronic parts by using the cleaning solution of the present invention, it can be exemplified with a method wherein the cleaning solution of the present invention is adjusted to be in said temperature range, and impregnating electronic parts in, or a method of spraying the cleaning solution of the present invention, which is heated to be in said temperature range by rotating electronic parts, on the surface of corresponding electronic parts. And also in such case, the physical cleaning method, such as irradiating supersonic waves or contacting a brush rotated or oscillated right and left may be accompanied thereto.

The cleaning solution of the present invention has excellent cleaning effects as well as inhibits corrosion against metal, for example silicon such as monocrystaline silicon, amorphous silicon, polycrystaline silicon, and the like, or metals other than silicon such as tungsten or copper, and is preferable for cleaning electronic parts such as a liquid crystal display, an integrated circuit device using silicon substrate and the like.

Hereinafter, the present invention will be described in more details by examples, but not limited thereto.

EXAMPLE 1

The cleaning solution was combined to be a composition described in Table 1 (hereinafter, referred to as 'the cleaning solution 1 of the present invention'). The cleaning solution 1 of the present invention was heated to 40° C. and 65° C. that provide a good cleaning effect, and the state of white turbidity of the solution when the solution is left heated was observed by the naked eyes. If the cleaning solution is transparent, it is indicated O, and if it is in white turbidity, it is indicated X. The result is indicated in

TABLE 1

|  |  | Temperature of the cleaning process |  |  |  |  |  |
|--|--|--|--|--|--|--|--|
|  |  | 40° C. | | | 65° C. | | |
|  |  | Hour at the temperature of the cleaning process | | | | | |
|  |  | 0 hr | 1 hr | 2 hr | 0 hr | 1 hr | 2 hr |
| Cleaning solution 1 of the present invention | Ammonia 0.3 wt. % Surfactant A 0.1 wt. % Surfactant B 0.1 wt. % Thioglycerol 0.1 wt. % water balance | O | O | O | O | O | O |

Surfactant A: ethylenediamine-added polyoxyethylenepolyoxypropylene condensate. A nonionic surfactant in which the average molecular weight of oxyethylene group is 2500~3000, a/(a+b)=0.4, and R is represented by formula (II) that is a residue group wherein hydrogen atom is removed from ethylenediamine.

Surfactant B: dodecyldiphenyletherdisulfonic acid ammonium. An anionic surfactant.

EXAMPLE 2

The cleaning solution was adjusted to be a composition described in Table 2 (hereinafter, referred to as 'the cleaning solution 1' and 'the comparative cleaning solution 1' of the present invention, respectively). A silicon wafer which a polystyrene latex aqueous dispersion solution having an average particle diameter of 0.6 μm was attached on its surface by a known spin coat method was used as a cleaned-material, and the cleaning solution 1 of the present invention adjusted to 40° C. or 65° C., and the comparative cleaning solution 1 adjusted to 65° C. were used to carry out the cleaning with a warm solution. The attached particle number before and after cleaning was measured and the particle removal rate was calculated, and also the state of white turbidity of the cleaning solution was observed by the naked eyes. In addition, the particle number in diameter of at least 0.1 μm on the silicon wafer attached with the polystyrene latex before cleaning was 3000~2800 particles/sheet.

Furthermore, as a cleaned-material, a test sheet (A) film-forming a poly-silicon film having a thickness of 1000 Å after film forming of the thermal oxidation film of 10000 Å on the silicon substrate, and a test sheet (B) forming a tungsten film having a thickness of 10000 Å after forming a poly-silicon having a thickness of 1000 Å on the silicon substrate were used and impregnated in the cleaning solution described in Table 2, and the corrosion with regard to the poly-silicon and tungsten was examined. The cleaning conditions and results are indicated in Table 2.

Surfactant A: ethylenediamine-added polyoxyethylenepolyoxypropylene condensate. A nonionic surfactant in which the average molecular weight of oxyethylene group is 2500~3000, a/(a+b)=0.4, and R is represented by formula (II) that is a residue group wherein hydrogen atom is removed from ethylenediamine.

Surfactant B: dodecyldiphenyletherdisulfonic acid ammonium. An anionic surfactant.

EFFECTS OF THE INVENTION

A new electronic parts cleaning solution that inhibits the corrosion of silicon or metals other than the silicon, and that efficiently cleans off fine dust or organic matters adhered on the surface of electronic parts, and that does not have white turbidity easily, can be provided. Also, the electronic parts cleaning solution of the present invention is stable at high temperature for a long period of time and since white turbidity does not occur, and thus it is industrially advantageous.

What is claimed:

1. An electronic parts cleaning solution which is characterized in containing an anionic surfactant, hydroxide, metal corrosion inhibitor, water, and a nonionic surfactant represented by formula (I) and/or a nonionic surfactant represented by formula (II):

$$HO\text{-}((EO)_x\text{---}(PO)_y)_z\text{---}H \tag{I}$$

$$R\text{-}[((EO)_a\text{---}(PO)_b)_c\text{---}H]_m \tag{II}$$

(EO is an oxyethylene group, and PO is an oxypropylene group. x and y, and a and b are positive numbers, which x/(x+y) and a/(a+b) are 0.05 to 0.5 respectively, and z and c are positive integers. R is a monovalent group of $$R1\text{-}O\text{---} \tag{1}$$

$$H_2N\text{---}R1\text{-}NH\text{---} \tag{2}$$

$$H_2N\text{---}R1\text{-}O\text{---} \tag{3}$$

TABLE 2

| Composition | | Cleaning temperature | Presence/absence of white turbidity | Particle removal rate (%) | Corrosion rate of (A) (Å/min) | Corrosion rate of (B) (Å/min) |
|---|---|---|---|---|---|---|
| Cleaning solution 1 of the present invention | Ammonia 0.3 wt. % Surfactant A 0.1 wt. % Surfactant B 0.1 wt. % Thioglycerol 0.1 wt. % Water balance | 40° C. | Absence | 71.9 | 0.2 | 3.4 |
| Cleaning solution 1 of the present invention | Ammonia 0.3 wt. % Surfactant A 0.1 wt. % Surfactant B 0.1 wt. % Thioglycerol 0.1 wt. % Water balance | 65° C. | Absence | 92.3 | 0.2 | 4.8 |
| Comparative cleaning solution 1 | Ammonia 0.3 wt. % Water balance | 65° C. | Absence | Unable to measure | 32.4 | 11.1 | a divalent group of

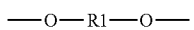
(4)

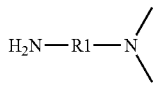
(5)

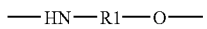
(6)

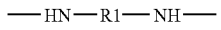
(7)

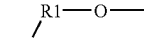
(8)

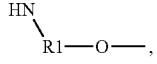

a trivalent group of

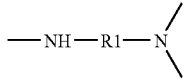
(9)

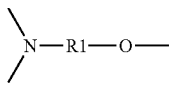
(10)

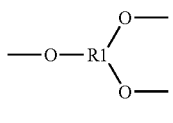
(11)

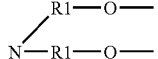
(12)

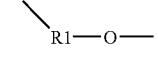, and a tetravalent group of

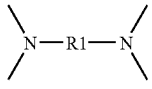
(13)

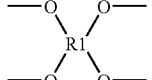
(14)

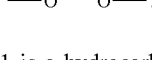.

R1 is a hydrocarbon group having $C_{1-20}$, which may be substituted with hydroxy group and/or alkyl group, and m is an integer from 1 to 4 corresponding the valency of R).

2. The solution according to claim 1, characterized in further containing a reducing agent.

3. The solution according to claim 1, characterized in that said hydroxide is organic hydroxide or inorganic hydroxide.

4. The solution according to claim 1, characterized in that the concentration of said hydroxide is 0.01 to 31 wt %.

5. The solution according to claim 1, characterized in that said metal corrosion inhibitor is an organic compound having at least one selected from the group consisting of nitrogen, oxygen, phosphorous and sulfur atom in molecule.

6. The solution according to claim 5, characterized in that said organic compound having at least one selected from the group consisting of nitrogen, oxygen, phosphorous and sulfur atoms in molecule is one of the following compounds:
   (1) a compound having at least one mercapto group in molecule,
   (2) a compound comprising at least one azole group in molecule,
   (3) a compound having at least two hydroxy group in molecule,
   (4) a compound comprising at least one hydroxy group and carboxy group in molecule and
   (5) a compound comprising at least one mercapto group, being an aliphatic alcohol compound wherein at least two carbons are comprised and the carbon attached to mercapto group is adjacent to the carbon attached to hydroxy group.

7. The solution according to claim 1, characterized in that said metal corrosion inhibitor is contained by 0.0001-5 wt %.

8. The solution according to claim 1, characterized in that said anionic surfactant has at least two anionic functional groups.

9. The solution according to claim 8, characterized in that said anionic surfactant further has ether bond in molecular structure.

10. The solution according to claim 8, characterized in that said anionic functional group is at least one selected from the group consisting of sulfonic group, sulfuric acid ester group, phosphate group and carboxy group.

11. A method for cleaning electronic parts, characterized in using the cleaning solution of claim 1.

12. A method for cleaning electronic parts on which tungsten is exposed, characterized in using the solution of claim 11 in which metal corrosion inhibitor is at least one selected from the group consisting of a compound having at least one mercapto group in molecule, a compound comprising at least two hydroxy group in molecule and a compound having at least one hydroxy group and carboxy group in molecule.

13. A method for cleaning electronic parts on which copper is exposed, characterized in using the solution of claim 11 in which metal corrosion inhibitor is at least one selected from the group consisting of a compound comprising at least one azole group in molecule and a compound comprising at least one mercapto group in molecule, being an aliphatic alcohol compound wherein at least two carbon is comprised and the carbon attached to mercapto group is adjacent to the carbon attached to hydroxy group.

* * * * *